United States Patent
Maruyama

(10) Patent No.: US 6,862,236 B2
(45) Date of Patent: Mar. 1, 2005

(54) FERROELECTRIC MEMORY DEVICE WITH AN EQUALIZATION CIRCUIT CONNECTED BETWEEN WORD VOLTAGE SUPPLY LINES AND BIT VOLTAGE SUPPLY LINES

(75) Inventor: Akira Maruyama, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/747,395

(22) Filed: Dec. 30, 2003

(65) Prior Publication Data

US 2004/0213038 A1 Oct. 28, 2004

(30) Foreign Application Priority Data

Jan. 7, 2003 (JP) ........................................ 2003-001385

(51) Int. Cl.[7] .................................................. G11C 7/20
(52) U.S. Cl. ...................... 365/202; 365/145; 365/228; 365/189.09
(58) Field of Search ................................ 365/145, 228, 365/226, 189.09, 202

(56) References Cited

U.S. PATENT DOCUMENTS

| | | | | | |
|---|---|---|---|---|---|
| 6,081,461 | A | * | 6/2000 | Shirley et al. ............... | 365/190 |
| 6,091,644 | A | * | 7/2000 | Hsu et al. ............... | 365/185.33 |
| 6,104,653 | A | * | 8/2000 | Proebsting ................... | 365/203 |
| 6,188,614 | B1 | * | 2/2001 | Hsu et al. ............... | 365/185.33 |
| 6,214,668 | B1 | * | 4/2001 | Hsu et al. .................... | 438/257 |
| 6,788,564 | B2 | * | 9/2004 | Hamada ....................... | 365/145 |

FOREIGN PATENT DOCUMENTS

JP    A 91-116107    5/1997    ........... H01L/27/10

OTHER PUBLICATIONS

U.S. Appl. No. 10/393,439, Yamamura, filed Mar. 20, 2003.
U.S. Appl. No. 10/747,523, Maruyama, filed Dec. 30, 2003.
U.S. Appl. No. 10/737,959, Maruyama, filed Dec. 18, 2003.
U.S. Appl. No. 10/752,184, Maruyama, filed Jan. 7, 2004.
U.S. Appl. No. 10754,691, Maruyama, filed Jan. 12, 2004.
U.S. Appl. No. 10/758,179, Maruyama, filed Jan. 16, 2004.

* cited by examiner

Primary Examiner—Andrew Q. Tran
(74) Attorney, Agent, or Firm—Oliff & Berridge, PLC

(57) ABSTRACT

A ferroelectric memory device has a function of protecting data held in memory cells from an unexpected unstable power supply voltage generated when the power is turned on or off, or when reading or writing data, and a function of reducing power consumption during reading or writing of data. The ferroelectric memory device includes a short circuit which is operated when the power is turned on or off, or after reading or writing of data occurs. The short circuit short-circuits all of a voltage supply line for a selected word line, a voltage supply line for an unselected word line, a voltage supply line for a selected bit line and a voltage supply line for an unselected bit line, or short-circuits the voltage supply line for the unselected word line and the voltage supply line for the unselected bit line.

15 Claims, 14 Drawing Sheets

FERROELECTRIC MEMORY DEVICE WITH AN EQUALIZATION CIRCUIT CONNECTED BETWEEN WORD VOLTAGE SUPPLY LINES AND BIT VOLTAGE SUPPLY LINES

Japanese Patent Application No. 2003-1385, filed on Jan. 7, 2003, is hereby incorporated by reference in its entirety.

BACKGROUND OF THE INVENTION

The present invention relates to a ferroelectric memory device.

As a ferroelectric memory device, an active ferroelectric memory device including 1T/1C cells in which one transistor and one ferroelectric capacitor are disposed in each memory cell, or including 2T/2C cells in which a reference cell is further disposed in each memory cell, has been known.

However, since the active ferroelectric memory device has a large memory area in comparison with a flash memory or EEPROM which is known as a nonvolatile memory device in which a memory cell is formed by one element, the capacity cannot be increased.

As a nonvolatile memory device which is more suitably increased in capacity, a ferroelectric memory device in which each memory cell is formed by one ferroelectric capacitor has been proposed (see Japanese Patent Application Laid-open No. 9-116107).

BRIEF SUMMARY OF THE INVENTION

A ferroelectric memory device in which each memory cell is formed by one ferroelectric capacitor has problems which must be solved before practical use, such as power consumption to be reduced, drive speed to be increased, and a problem occurring when the power is turned on/off. An objective of the present invention is to solve these problems.

A ferroelectric memory device according to the present invention includes:
a plurality of word lines disposed in parallel;
a plurality of bit lines disposed in parallel so as to intersect the word lines;
a plurality of ferroelectric memory cells disposed at respective intersecting points of the word lines and the bit lines;
a power supply circuit which generates a plurality of types of voltages including a word voltage and a bit voltage;
a word line driver section which drives the word lines;
a bit line driver section which drives the bit lines;
a plurality of voltage supply lines which supply the plurality of types of voltages to the word line driver section and the bit line driver section from the power supply circuit; and
a short circuit which short-circuits a supply line of the word voltage and a supply line of the bit voltage among the voltage supply lines.

According to the present invention, the word lines and the bit lines which intersect each other can be short-circuited by short-circuiting the supply line of the word voltage and the supply line of the bit voltage by using the short circuit. Therefore, the potential difference between two opposite ends of the ferroelectric memory cells connected with the word lines and the bit lines which intersect each other can be reduced to "0". This enables data to be held when the power supply voltage changes, or an equalize operation to be performed.

This ferroelectric memory device may include a voltage select circuit which selectively outputs the plurality of types of voltages generated by the power supply circuit to the word line driver section and the bit line driver section. The voltage supply lines may include a plurality of word voltage supply lines which connect the voltage select circuit with the word line driver section, and a plurality of bit voltage supply lines which connect the voltage select circuit with the bit line driver section. In this case, the short circuit may short-circuit at least one of the word voltage supply lines and at least one of the bit voltage supply lines.

The word voltage supply lines may include a first voltage-supply-line for a selected word line among the word lines and a second voltage-supply-line for an unselected word line among the word lines, and the bit voltage supply lines may include a third voltage-supply-line for a selected bit line among the bit lines and a fourth voltage-supply-line for an unselected bit line among the bit lines. In this case, the voltage select circuit may output voltages selected from among the plurality of types of voltages generated by the power supply circuit, corresponding to an access operation for the ferroelectric memory cells, to the first voltage-supply-line, the second voltage-supply-line, the third voltage-supply-line, and the fourth voltage-supply-line.

In this ferroelectric memory device, the short circuit may short-circuit all of the word voltage supply lines and the bit voltage supply lines when the power is turned on. The short circuit may short-circuit all of the word voltage supply lines and the bit voltage supply lines when the power is turned off. This enables the potential difference between two opposite ends of the ferroelectric memory cell to be reduced to "0" even if the power supply voltage is unstable, whereby the data can be held securely.

In this ferroelectric memory device, a data read operation or a data write operation of a selected memory cell among the ferroelectric memory cells may be implemented by executing at least one of operations of writing "0" and writing "1" into the selected memory cell. In this case, the short circuit may short-circuit all of the word voltage supply lines and the bit voltage supply lines after at least one of the operations of writing "0" or writing "1" has been executed. The equalize operation after each of the write operations can be realized by the short circuit. Moreover, the short circuit may short-circuit the second voltage-supply-line and the fourth voltage-supply-line during a period between the operations of writing "0" and writing "1". This causes a charge transfer to occur between the voltage supply line for the unselected word line and the voltage supply line for the unselected bit line, whereby a precharge effect can be achieved. Since the charge transfer is not caused by charging/discharging from the outside of the circuit but is caused by an internal short-circuit, power consumption can be reduced.

The above four types of short-circuit operations may be performed either individually or in combination of two or more. The short-circuit operation is realized at different timing by connecting a plurality of short-circuiting switch circuits between the voltage supply lines in parallel, and causing each of the switch circuits to operate at a different timing.

DETAILED DESCRIPTION OF THE EMBODIMENT

Embodiments of the present invention are described below with reference to the drawings.

General Operation

Figure 2:
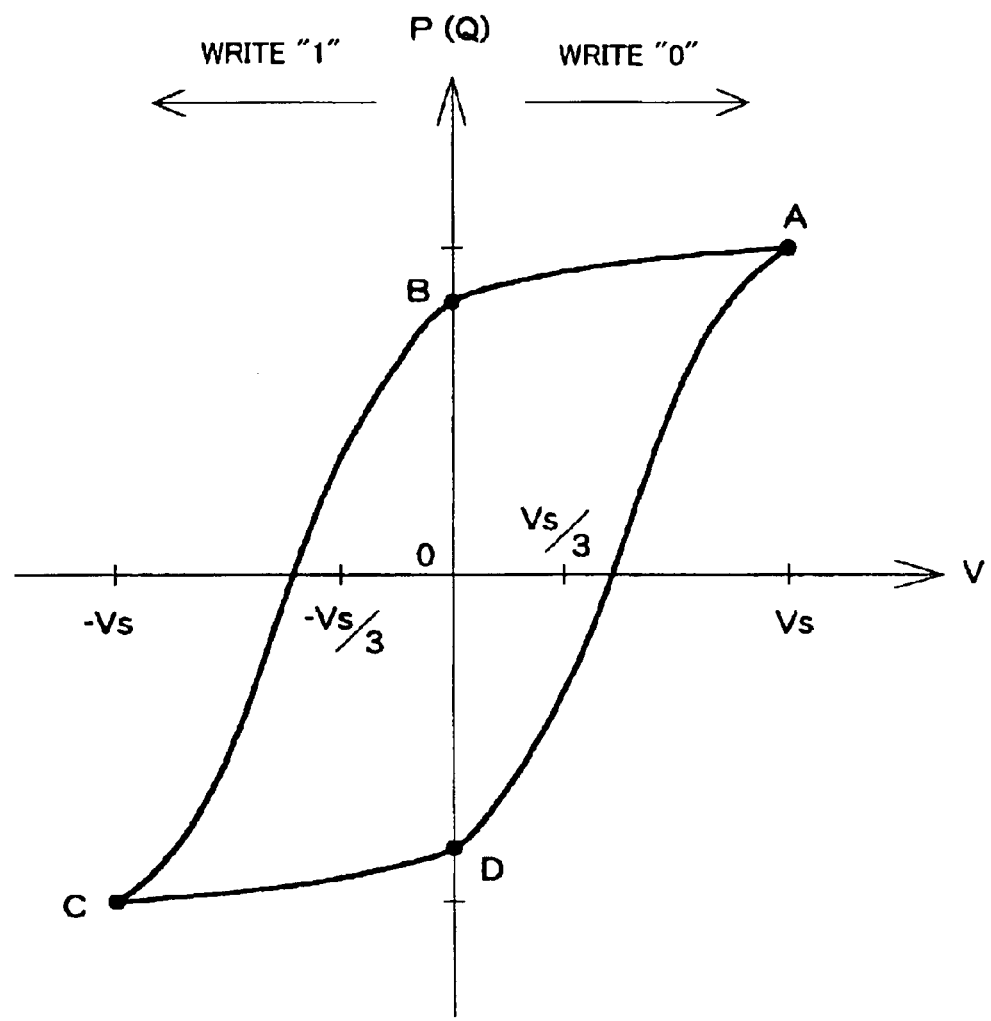
FIG. 2 shows a hysteresis curve of a ferroelectric.

A ferroelectric memory device (hereinafter may be called "FeRAM") is a nonvolatile memory device which utilizes a hysteresis phenomenon of a ferroelectric. The hysteresis phenomenon is described below with reference to FIG. 2, which shows a correlation diagram between a voltage applied to a ferroelectric and polarization of the ferroelectric. In FIG. 2, the vertical axis P (Q) indicates the polarization (amount of charge) of the ferroelectric, and the horizontal axis V indicates the voltage applied to the ferroelectric. The ferroelectric has two states including a polarization state when the applied voltage is negative and a polarization state when the applied voltage is positive.

In summary, a ferroelectric can be utilized as a storage medium for a memory device by considering the two polarization states of the ferroelectric as "0" and "1" of an electrical signal by controlling the voltage applied to the ferroelectric and the application direction.

Specifically, the FeRAM can be a memory device having nonvolatility.

In ferroelectric memory devices known at present, there are various methods relating to the control method for the applied voltage and the like on the assumption that the above-described basic characteristics are utilized.

A cross-point type FeRAM is one type of such ferroelectric memory devices. The cross-point type FeRAM is a destructive read type memory device. The destructive read is a type in which stored data is destroyed when reading the data. The destructive read necessarily requires a data rewrite operation. Specifically, reading of data includes two-stage steps consisting of a step of reading data and a step of rewriting the originally held data. Writing of data includes two-stage steps consisting of a step of writing data "0" and a step of writing data "1".

Therefore, reading of data from the memory device and writing of data in the memory device respectively include two steps. In the cross-point type FeRAM, the step of reading data is basically performed by writing data "0".

In the present embodiment, a step of writing data "0" in a ferroelectric capacitor (hereinafter may be called "memory cell") is called "read", and a step of writing data "1", in the ferroelectric capacitor is called "write". The rewrite step is called "rewrite". Since either "0" or "1" is written in rewrite, rewrite is either the read operation or the write operation. Specifically, the operation can be roughly divided into read and write.

A period between read and write and a period between read and rewrite are called standby states. Specifically, the standby state is a period in which data is not read from or written into the memory cell. The standby state includes a state immediately before read.

First Embodiment

Configuration

Figure 1:
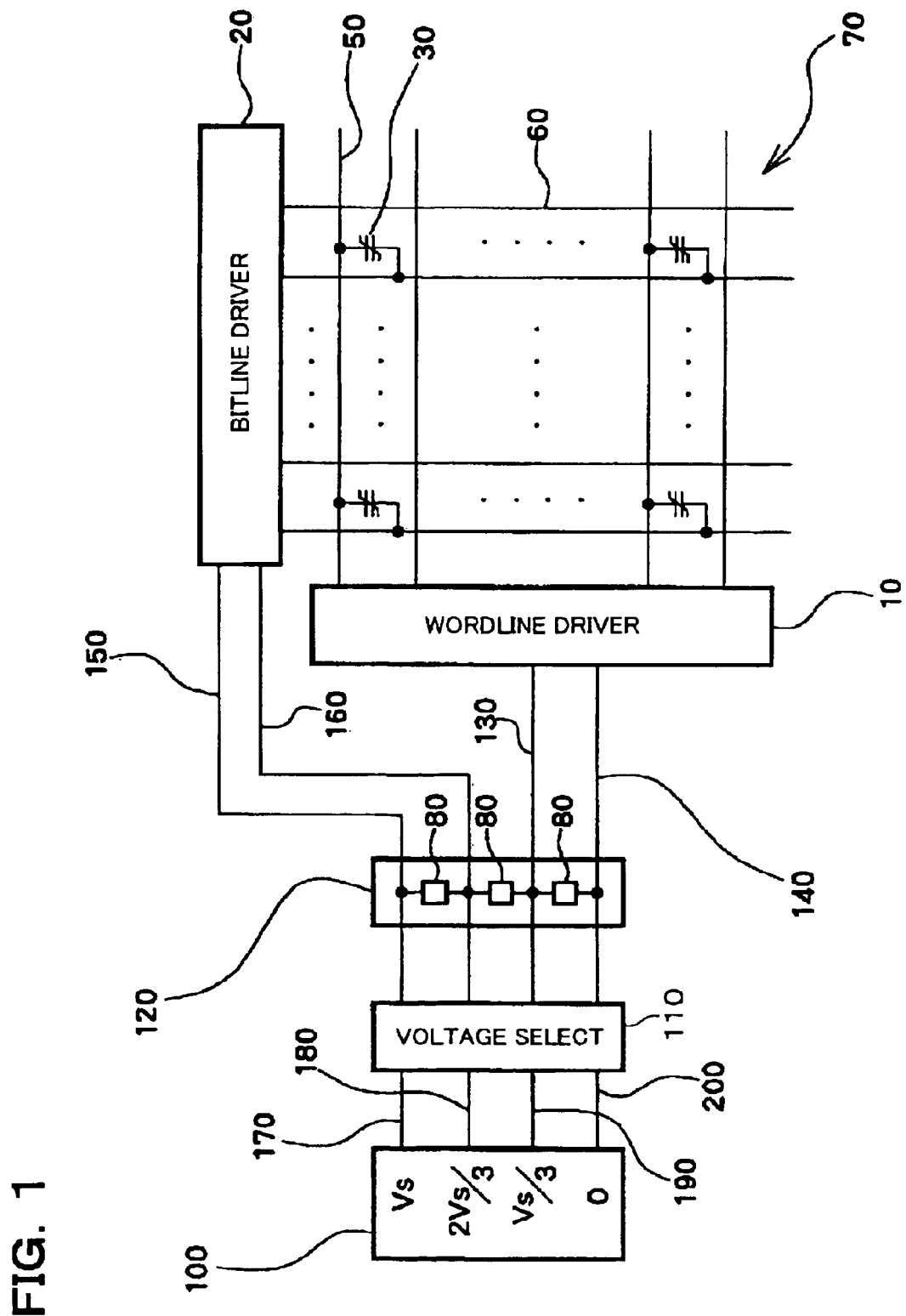
FIG. 1 is a block diagram of a ferroelectric memory device according to a first embodiment of the present invention.

FIG. 1 is a block diagram showing a ferroelectric memory device according to a first embodiment of the present invention.

In a memory cell array 70, a plurality of ferroelectric capacitors 30 are disposed in an array. In more detail, a ferroelectric film is disposed at least at each intersecting point of a plurality of word lines 50 and a plurality of bit lines 60. Therefore, the word lines 50 and the bit lines 60 function as electrodes and the ferroelectric film is located between the electrodes, whereby the ferroelectric capacitors 30 are disposed at the intersecting points of the word lines 50 and the bit lines 60. The word lines 50 are connected with a word line driver section 10, and the bit lines 60 are connected with a bit line driver section 20.

The FeRAM including the memory cell array 70, the word line driver section 10, and the bit line driver section 20 shown in FIG. 1 is generally called a cross-point type FeRAM. The cross-point type FeRAM can be highly integrated and multi-layered, since a transistor or the like is unnecessary for each memory cell 30.

A voltage supply line 130 for a selected word line (a first voltage-supply line) and a voltage supply line 140 for an unselected word line (a second voltage-supply-line) are connected with the word line driver section 10, and a voltage supply line 150 for a selected bit line (a third voltage-supply-line) and a voltage supply line 160 for an unselected bit line (a fourth voltage-supply-line) are connected with the bit line driver section 20.

A power supply circuit 100 which generates a plurality of types of voltages (Vs, 2Vs/3, Vs/3, 0) is provided as a power supply for driving the ferroelectric memory device. These voltages are used to perform read, write, and rewrite of the objective ferroelectric capacitor.

The power supply circuit 100 includes a first voltage output line 170 which outputs the voltage Vs, a second voltage output line 180 which outputs the voltage 2Vs/3, a third voltage output line 190 which outputs the voltage Vs/3, and a fourth voltage output line 200 which outputs the voltage 0. A voltage select circuit 110 selectively outputs voltages corresponding to the voltage supply line 130 for the selected word line, the voltage supply line 140 for the unselected word line, the voltage supply line 150 for the selected bit line, and the voltage supply line 160 for the unselected bit line from the voltages output from the power supply circuit 100. The voltages selectively output from the voltage select circuit 110 are supplied to the word line driver section 10 or the bit line driver section 20 through the voltage supply lines 130 to 160.

A short circuit 120 is provided in the middle of the voltage supply lines 130 to 160. In the short circuit 120, a plurality of switch circuits 80 are connected at a plurality of locations at which the voltage supply lines 130 to 160 are connected so that all the voltage supply lines 130 to 160 are short-circuited. A plurality of combinations may be employed as the combination for connecting the voltage supply lines 130 to 160 and the switch circuits 80. In this example, one switch circuit 80 is connected between the voltage supply line 130 for the selected word line and the voltage supply line 140 for the unselected word line, one switch circuit 80 is connected between the voltage supply line 150 for the selected bit line and the voltage supply line 160 for the unselected bit line, and one switch circuit 80 is connected between the voltage supply line 140 for the unselected word line and the voltage supply line 150 for the selected bit line.

Operation

The operation of the ferroelectric memory device shown in FIG. 1 is described below.

The basic operation of the ferroelectric memory device is to apply voltages to the ferroelectric capacitors 30 disposed in the memory cell array 70. Since the ferroelectric capacitors 30 are disposed in the memory cell array 70 in the shape of a matrix, a step of selecting the memory cell 30 is necessary in the same manner as in a conventional memory. A method of consecutively selecting the bit lines 60 in a state in which the word line 50 is selected is used in the step of selecting the memory cell 30. Specifically, the word line 50 is selected by the word line driver section 10, and the memory cells 30 are accessed by consecutively selecting the bit lines 60 by the bit line driver section 20.

A process for selecting one of the memory cells 30 is described below. The memory cells 30 connected with the single word line 50 may be selected at the same time.

When one of the word lines 50 is selected, the word line driver section 10 outputs the voltage supplied from the voltage supply line 130 for the selected word line to the selected word line 50. The word line driver section 10 outputs the voltage supplied from the voltage supply line 140 for the unselected word line to the remaining word lines 50. In the present embodiment, the word line 50 to which the voltage supplied from the voltage supply line 130 for the selected word line is output is called a selected word line, and the word line 50 to which the voltage supplied from the voltage supply line 140 for the unselected word line is output is called an unselected word line. The bit line driver section 20 outputs the voltage supplied from the voltage supply line 150 for the selected bit line to one of the bit lines 60. The bit line driver section 20 outputs the voltage supplied from the voltage supply line 160 for the unselected bit line to the remaining bit lines 60. In the present embodiment, the bit line 60 to which the voltage supplied from the voltage supply line 150 for the selected bit line is output is called a selected bit line, and the bit line 60 to which the voltage supplied from the voltage supply line 160 for the unselected bit line is output is called an unselected bit line.

All the memory cells 30 can be accessed by successively performing the above process.

The voltage applied to the memory cell 30, that is, the voltage difference between the selected word line 50 and the selected bit line 60 is changed corresponding to the output voltages selected by the voltage select circuit 110. Data is read from or written into the memory cell 30 by controlling the voltage difference.

Figure 3:
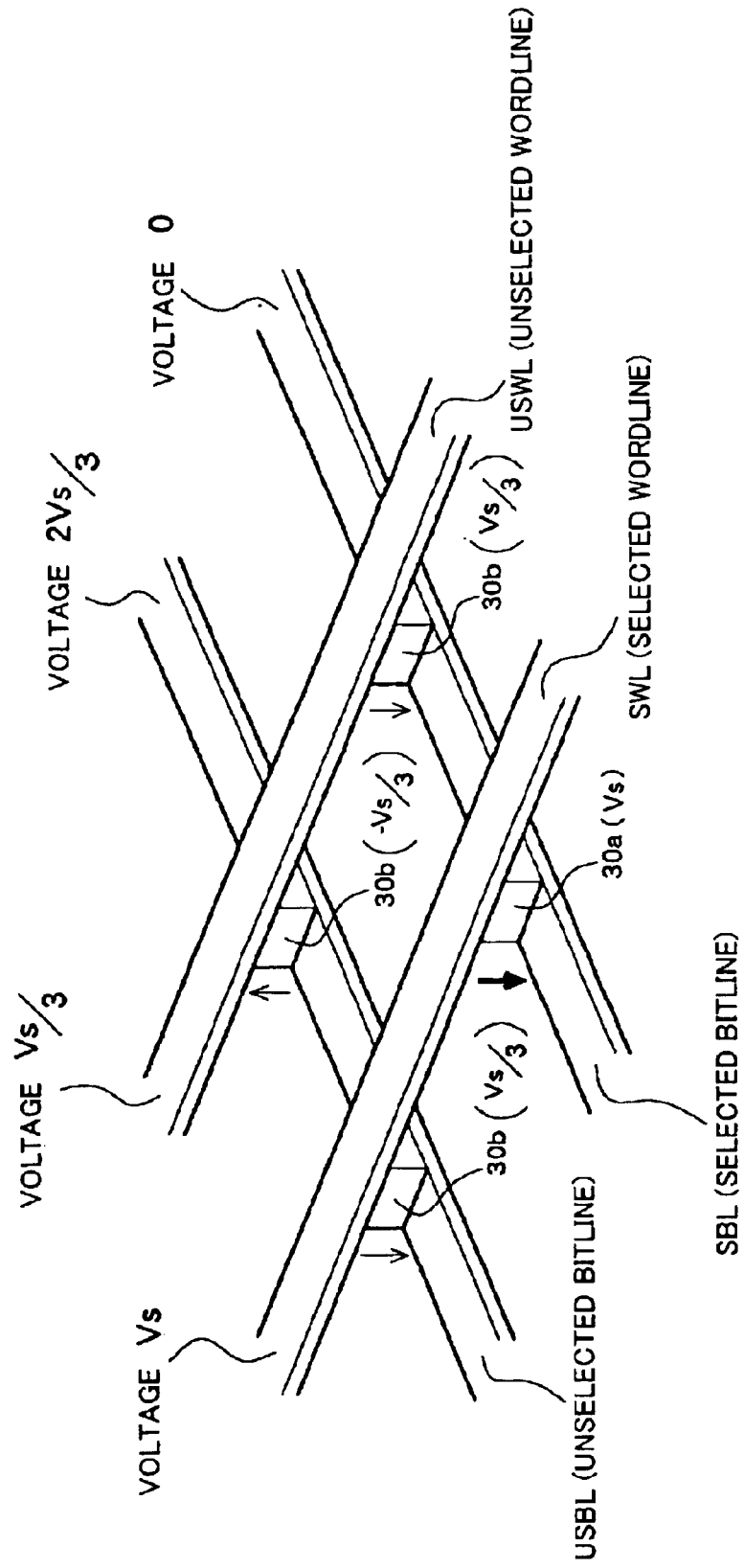
FIG. 3 shows a memory cell array during reading according to the first embodiment of the present invention.

FIG. 3 explicitly shows the voltage application state of the word lines 50, the bit lines 60, and the memory cells 30 during reading. A memory cell 30a shown in FIG. 3 indicates the selected memory cell 30, and a memory cell 30b indicates the unselected memory cell 30. In FIG. 3, a symbol SBL indicates the selected bit line, a symbol USBL indicates the unselected bit line, a symbol SWL indicates the selected word line, and a symbol USWL indicates the unselected word line. During reading, the voltage 0 is supplied to the selected bit line from the voltage select circuit 110, the voltage 2Vs/3 is supplied to the unselected bit line from the voltage select circuit 10, the voltage Vs is supplied to the selected word line from the voltage select circuit 10, and the voltage Vs/3 is supplied to the unselected word line from the voltage select circuit 110. In FIG. 3, the selected word line SW is set at the voltage Vs, the unselected word line USWL is set at the voltage Vs/3, the selected bit line SBL is set at the voltage 0, and the unselected bit line USBL is set at the voltage 2Vs/3. This allows the voltage difference between the selected word line SWL and the selected bit line SBL to be Vs, whereby the polarization state transitions from the point B or the point D to the point A in the hysteresis curve shown in FIG. 2, whereby data "0" is written in the memory cell 30a.

Figure 4:
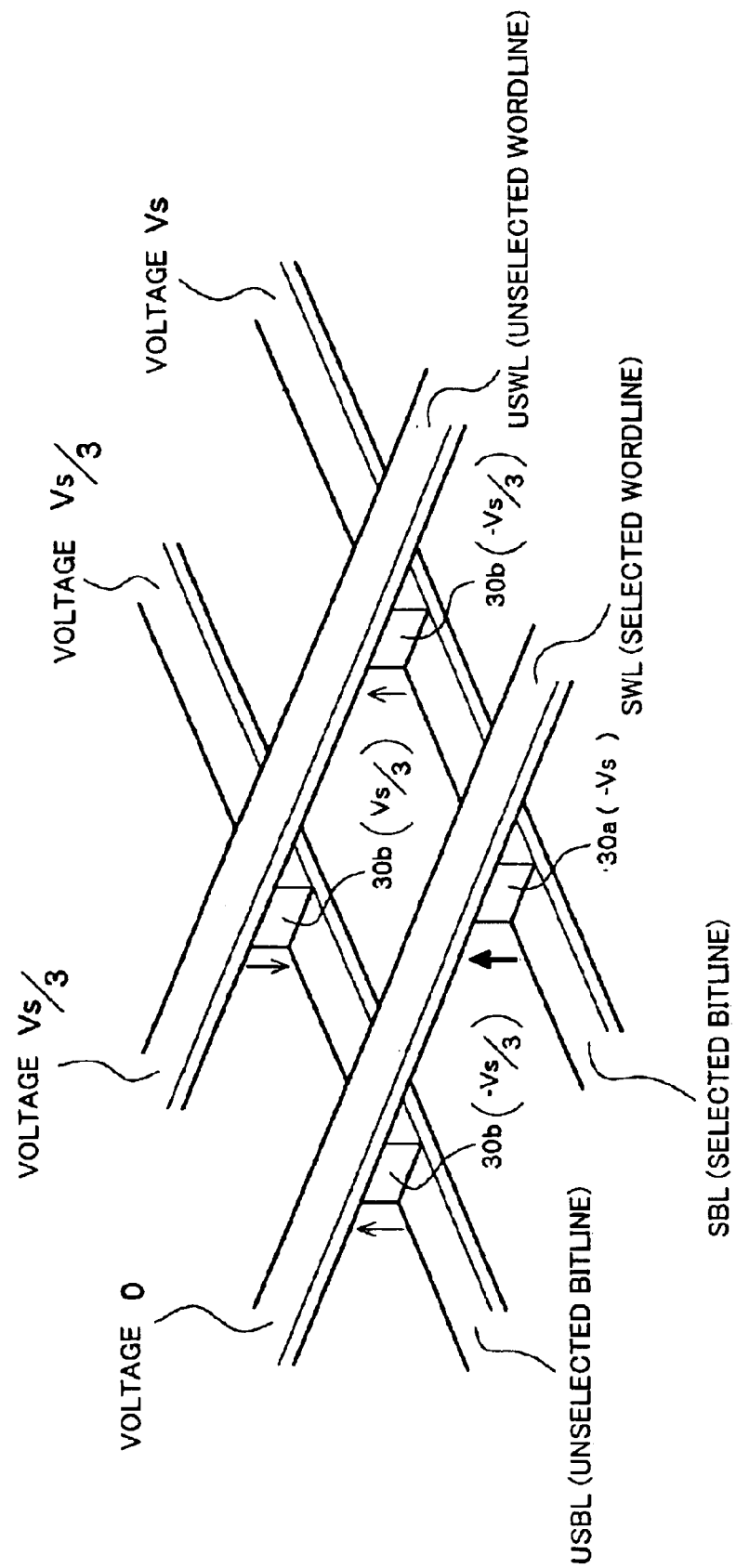
FIG. 4 shows a memory cell array during writing according to the first embodiment of the present invention.

FIG. 4 explicitly shows the voltage application state of the word lines 50, the bit lines 60, and the memory cells 30 during writing. A memory cell 30a shown in FIG. 4 indicates the selected memory cell 30, and memory cells 30b indicate the unselected memory cells 30. The symbols SBL, USBL, SWL, and USWL in FIG. 4 have the same meaning as the same symbols in FIG. 3. During writing, the voltage 0 is supplied to the selected word line 50 from the voltage select circuit 110, the voltage 2Vs/3 is supplied to the unselected word line 50 from the voltage select circuit 110, the voltage Vs is supplied to the selected bit line 60 from the voltage select circuit 110, and the voltage Vs/3 is supplied to the unselected bit line 60 from the voltage select circuit 10. In FIG. 4, the selected word line SWL is set at the voltage 0, the unselected word line USWL is set at the voltage 2Vs/3, the selected bit line SBL is set at the voltage Vs, and the unselected bit line USBL is set at the voltage Vs/3. This allows the voltage difference between the selected word line SWL and the selected bit line SBL to be −Vs, whereby data "1" is written in the memory cell 30a through the point C in the hysteresis curve shown in FIG. 2.

In the present embodiment, the voltage supply lines 130 to 160 are short-circuited when the power is turned on/off, in addition to the above normal operation. The short circuit 120 protects data held in the ferroelectric memory device in a state in which the power supply voltage is unstable when the power is turned on/off, and is operated for a given period after power on and a given period after power off.

Figure 5:
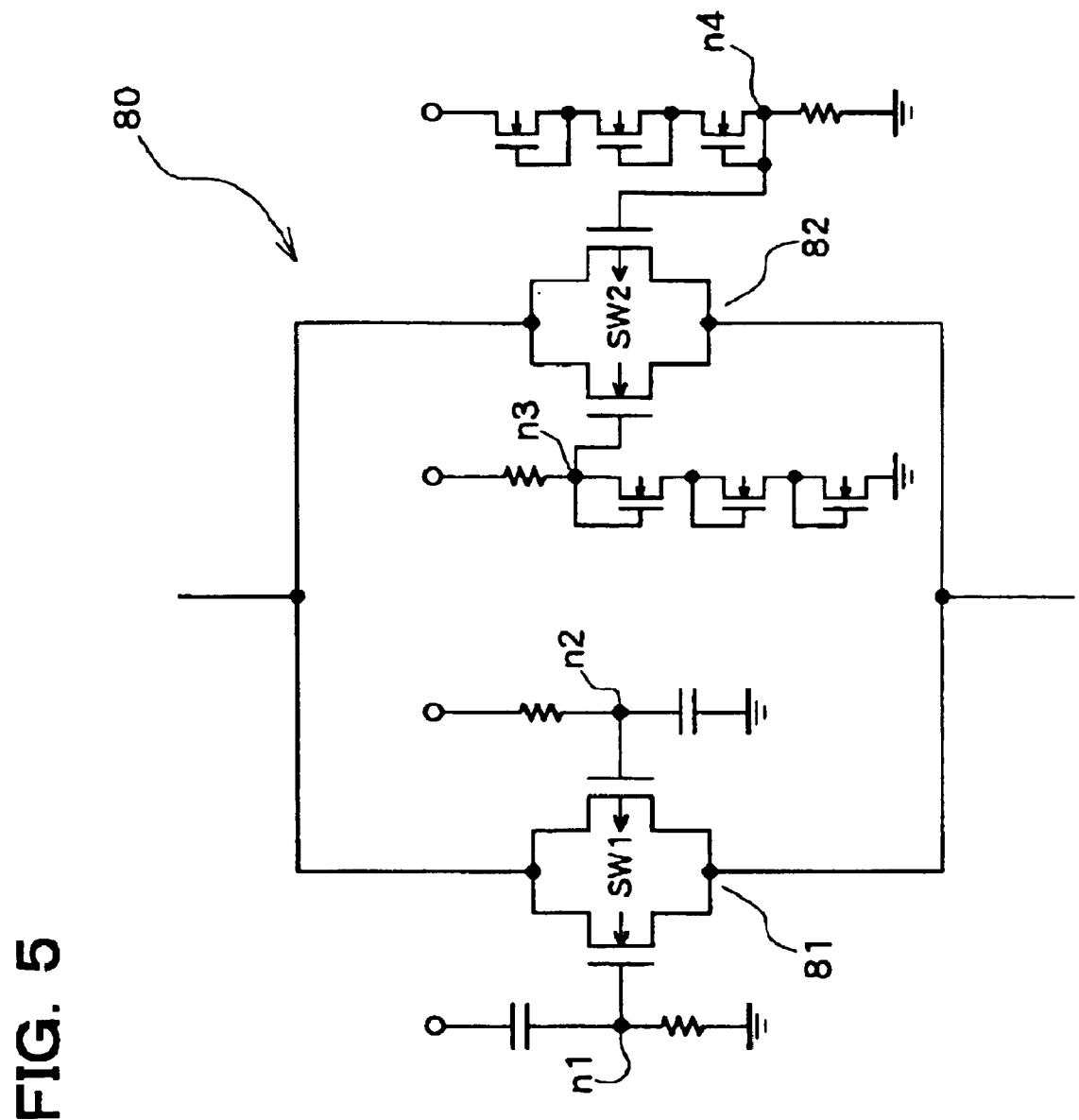
FIG. 5 is an equivalent circuit diagram of a switch circuit according to the first embodiment of the present invention.

FIG. 5 shows an equivalent circuit of the switch circuit 80 included in the short circuit 120. The switch circuit 80 includes a switch circuit 81 and a switch circuit 82, and is designed to be operated when the power is turned on/off. The switch circuit 81 in the switch circuit 80 is operated during power on. The short circuit 120 is operated by allowing the switch circuit 80 to conduct electricity for a given period. The switch circuit 82 in the switch circuit 80 is operated during power off. The short circuit 120 is operated by allowing the switch circuit 80 to conduct electricity for a given period. Each of the switch circuits 81 and 82 is formed by using a transfer gate including an NMOS transistor and a pMOS transistor, for example. In FIG. 5, a symbol n1 indicates an nMOS gate terminal connection point n1 of the switch circuit 81, and a symbol n2 indicates a pMOS gate terminal connection point n2 of the switch circuit 81. In FIG. 5, a symbol n3 indicates an nMOS gate terminal connection point n3 of the switch circuit 82, and a symbol n4 indicates a pMOS gate terminal connection point n4 of the switch circuit 82.

Figure 6:
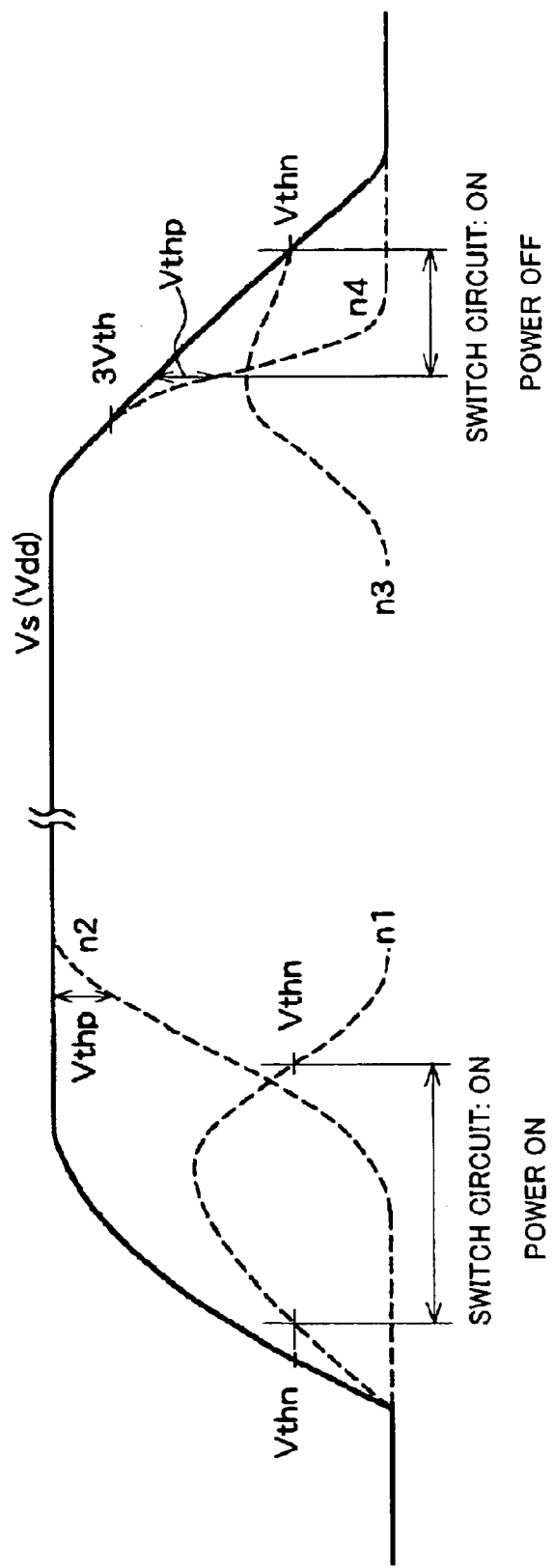
FIG. 6 shows an operation state of a switch circuit according to the first embodiment of the present invention and a voltage change in power supply voltage.

FIG. 6 shows a change in the voltage applied to each of the gate terminal connection points n1 to n4 of the switch circuits 81 and 82, a change in the power supply voltage Vs (Vdd) from power on to after power off, and on/off states of the first and second switch circuits 81 and 82.

In FIG. 6, a period in which the switch circuit 80 is in an on state means an on-period in power-on time in which the switch circuit 81 is in an on state and an on-period in power-off time in which the switch circuit 82 is in an on state.

The switch circuit 81 is in an on-state when the following first and second states are satisfied. The first state is a state in which the voltage of the NMOS gate terminal connection point n1 of the switch circuit 81 exceeds a gate voltage threshold value Vthn of the nMOS transistor of the switch circuit 81. The second state is a state in which the voltage difference between the voltage of the pMOS gate terminal connection point n2 of the switch circuit 81 and the operating voltage Vs exceeds the absolute value of a gate voltage threshold value Vthp of the pMOS transistor of the switch circuit 81.

The switch circuit 82 is in an on state when the following first and second states are satisfied. The first state is a state in which the voltage of the nMOS gate terminal connection point n3 of the switch circuit 82 exceeds a gate voltage threshold value Vthn of the nMOS transistor of the switch circuit 82. The second state is a state in which the voltage difference between the voltage of the pMOS gate terminal connection point n4 of the switch circuit 82 and the operating voltage Vs exceeds the absolute value of a gate voltage threshold value Vthp of the pMOS transistor of the switch circuit 82.

In the present embodiment, the constituent parts of the switch circuit 80 shown in the switch circuit diagram of FIG. 5 are designed so that a period in which data held in the ferroelectric memory device may be affected by an unstable power supply voltage overlaps a period in which the switch circuit 80 is in an on state. The period in which the power supply voltage is unstable is a period until the power supply voltage Vdd becomes stable as the operating voltage Vs after power on and a period until the power supply voltage falls completely after power off.

Therefore, since the switch circuit 80 is in an on state in the on-period in power-on time on and the on-period in power-off time shown in FIG. 6, the data held in the ferroelectric memory device can be protected when the power is turned on/off. In the present embodiment, the operating time of the short circuit is set in the design stage. However, it is possible to employ a method in which a circuit which checks rise and fall of the power supply voltage is directly provided in the ferroelectric memory device, and the operating time of the short circuit is automatically determined each time. It is also possible to employ a method in which a millisecond timer which sets the operating time of the short circuit is connected with the switch circuit 80.

Second Embodiment
Configuration

Figure 7:
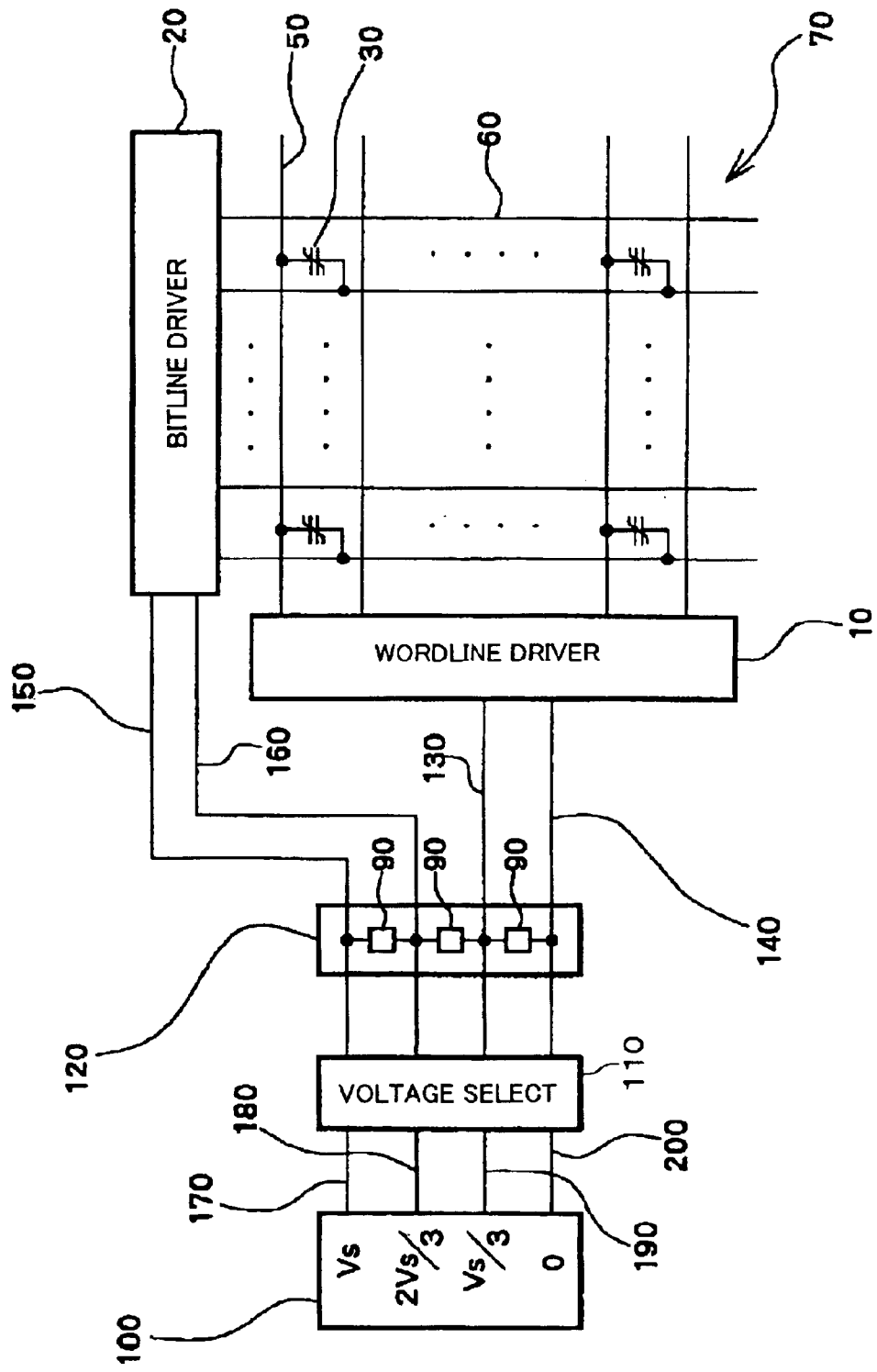
FIG. 7 is a block diagram of a ferroelectric memory device according to a second embodiment of the present invention.

FIG. 7 is a block diagram of a ferroelectric memory device according to a second embodiment of the present invention.

The present embodiment differs from the first embodiment in the configuration of the short circuit 120. In the present embodiment, switch circuits 90 are provided in the short circuit 120 instead of the switch circuits 80 used in the short circuit 120 in the first embodiment. In the present embodiment, the switch circuits 90 are disposed in the short circuit 120 in the same manner as the switch circuits 80 in the first embodiment.

Figure 8:
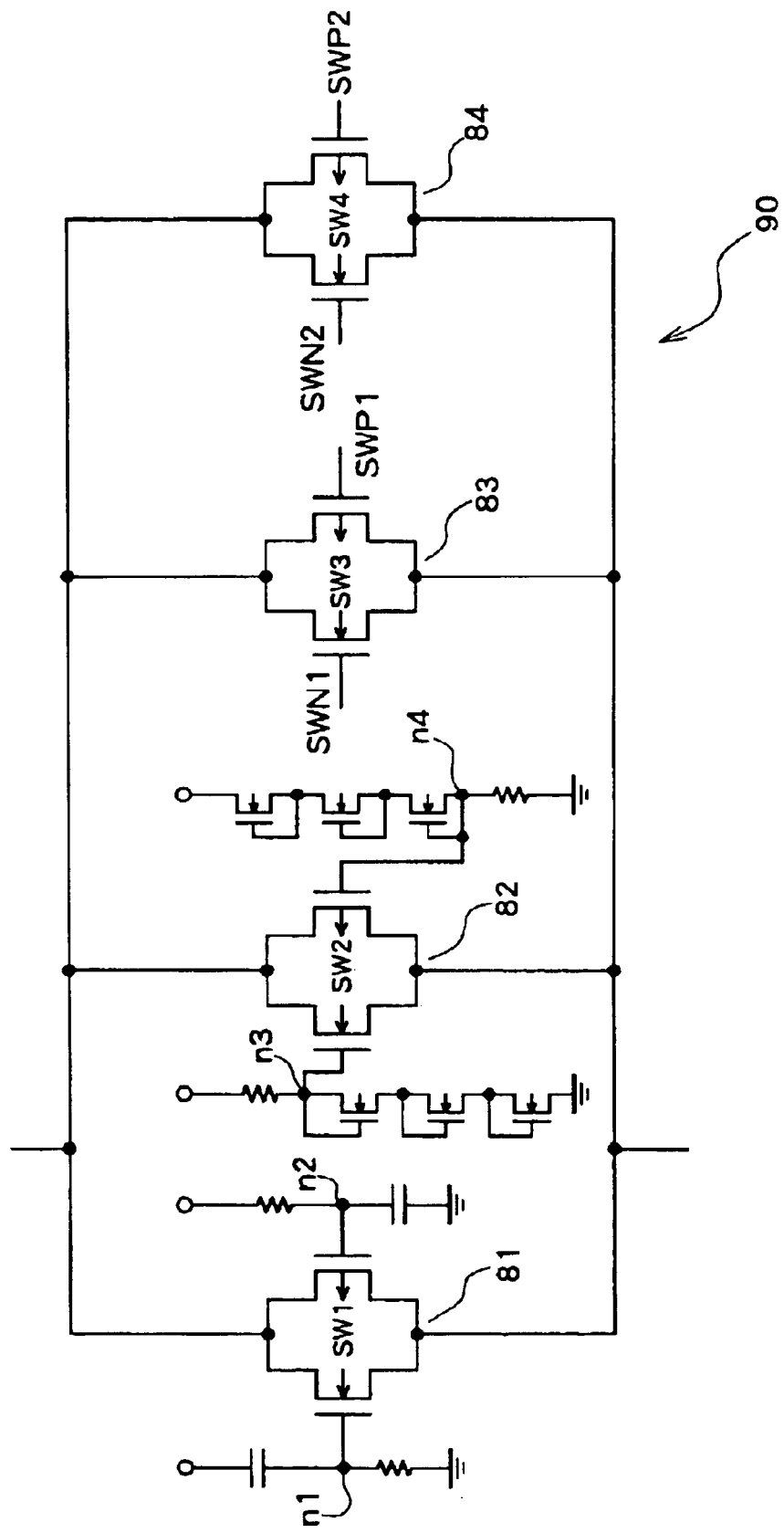
FIG. 8 is an equivalent circuit diagram of a switch circuit according to the second embodiment of the present invention.

FIG. 8 shows an equivalent circuit of the switch circuit 90. As shown in FIG. 8, the switch circuit 90 includes a switch circuit 81, a switch circuit 82, a switch circuit 83, and a switch circuit 84.

Figure 9:
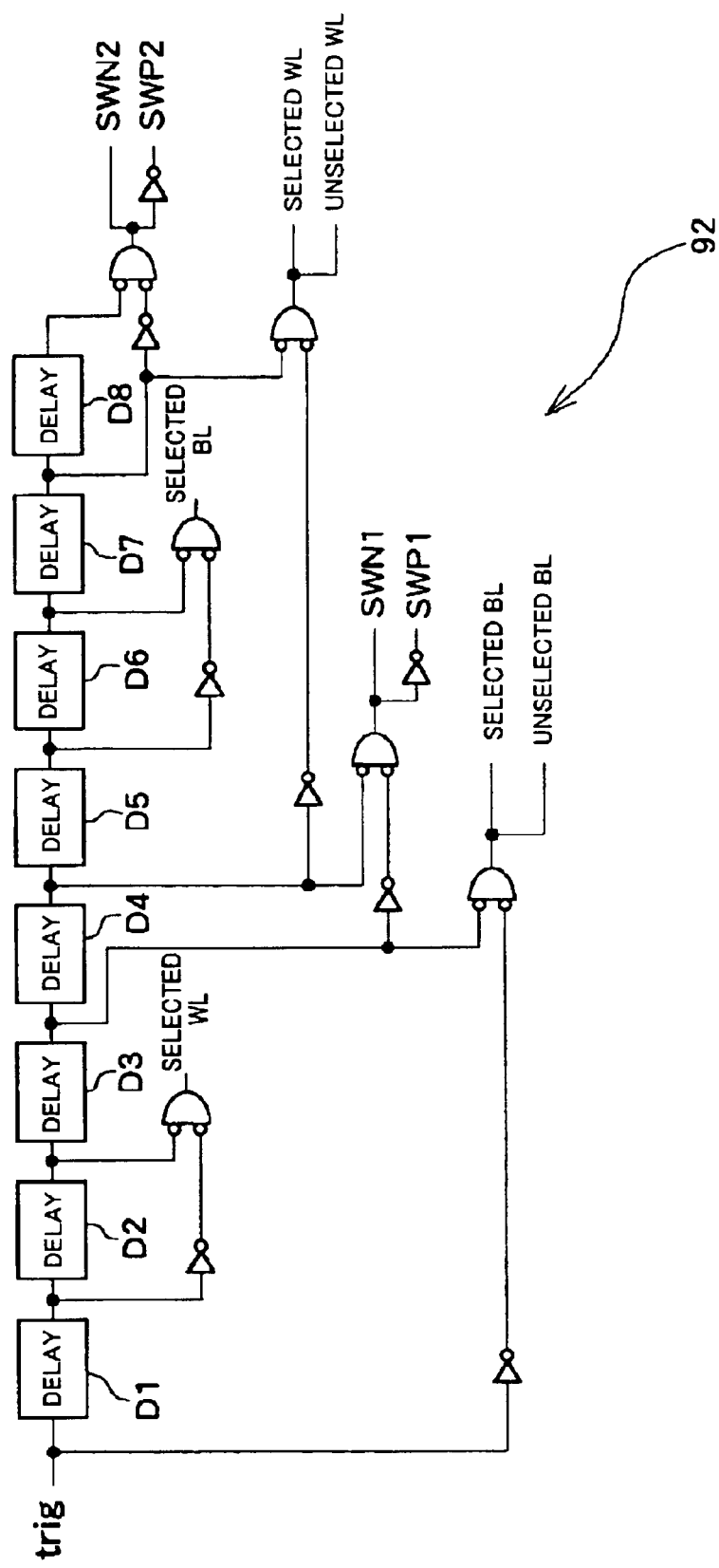
FIG. 9 is an equivalent circuit diagram of delay circuits used to drive memory cells according to the second embodiment of the present invention.

FIG. 9 is a block diagram showing a control circuit 92 which controls the operations of switches (not shown) in the word line driver section 10 and the bit line driver section 20 shown in FIG. 7 and the switch circuits 90 shown in FIG. 8. The control circuit 92 outputs signals which drive switches (not shown) for switching connection/disconnection between the selected word line, the unselected word line, the selected bit line, and the unselected bit line and the voltage supply lines 130 to 160. The control circuit 92 outputs signals which drive the third switch circuit 83 and the fourth switch circuit 84. A trigger signal trig which is input to the control circuit 92 shown in FIG. 9 is generated each time the data is read or written. In the present embodiment, if an instruction for reading or writing of data is issued, read (write "0") and the subsequent write (write "1") are performed as described above.

Operation

The operation of the ferroelectric memory device shown in FIG. 7 is described below.

The operation of the ferroelectric memory device differs between the present embodiment and the first embodiment in that the switch circuit 83 or 84 shown in FIG. 8 is necessarily in an on state after the read or write operation.

Each of delay circuits D1 to D8 provided in the control circuit 92 shown in FIG. 9 delays the signal for a given period of time. The delay circuits D1, D2, and D3 create time intervals during reading, and the delay circuits D5, D6, and D7 create time intervals during writing. The delay circuit D4 indicates a time interval between read and write. The delay circuit D8 creates the operating time of the fourth switch circuit 84.

In FIG. 9, a signal which causes the switch circuit 83 to be in an on state is output in the delay period set by the delay circuit D4, and a signal which causes the switch circuit 84 to be in an on state is output in the delay period set by the delay circuit D8. Specifically, the short circuit 120 is operated after read and write by the switch circuits 83 and 84 shown in FIG. 8 and the control circuit 92 shown in FIG. 9. This feature is explicitly described below using FIG. 10.

Figure 10:
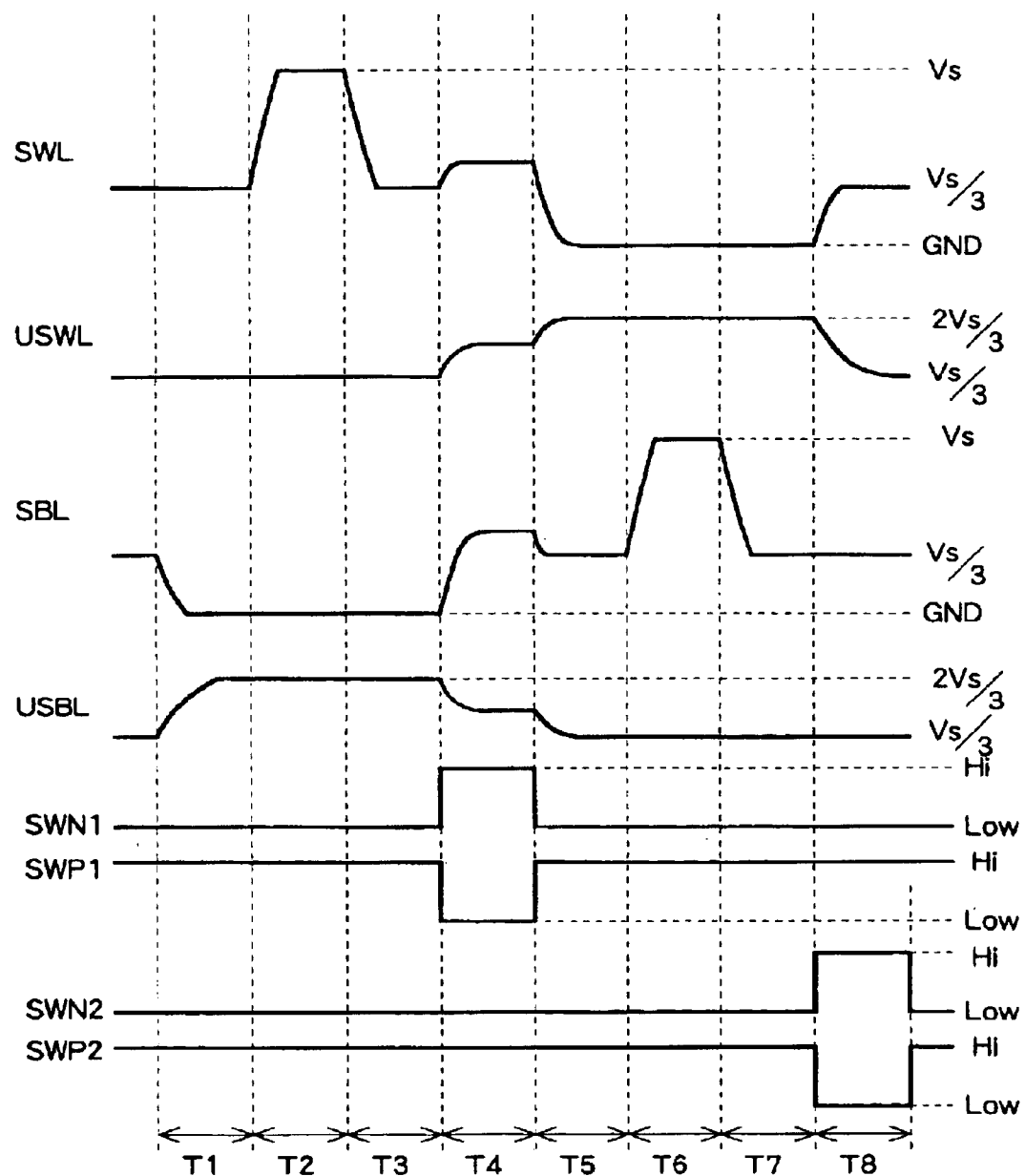
FIG. 10 is a waveform diagram of voltages applied to word lines, bit lines, and switch circuits according to the second embodiment of the present invention.

FIG. 10 shows a waveform diagram of the voltages applied to the selected word line SWL, the unselected word line USWL, the selected bit line SBL, the unselected bit line USBL, the switch circuit 83, and the switch circuit 84. T1 to T8 shown in FIG. 10 respectively indicate the delay time set by the delay circuits D1 to D8 shown in FIG. 9. In FIG. 10, the switch circuit 83 is operated during the time T4, and the switch circuit 83 is operated during the time T8. Specifically, the short circuit 120 is operated during the time T4 created by the delay circuit D4 and the time T8 created by the delay circuit D8.

The addition of the switch circuits 83 and 84 not only enables the memory cells 30 to be protected when the power is turned on/off, but also enables the memory cells 30 after read and write to be protected from an unexpected change in the power supply voltage.

Third Embodiment
Configuration

Figure 11:
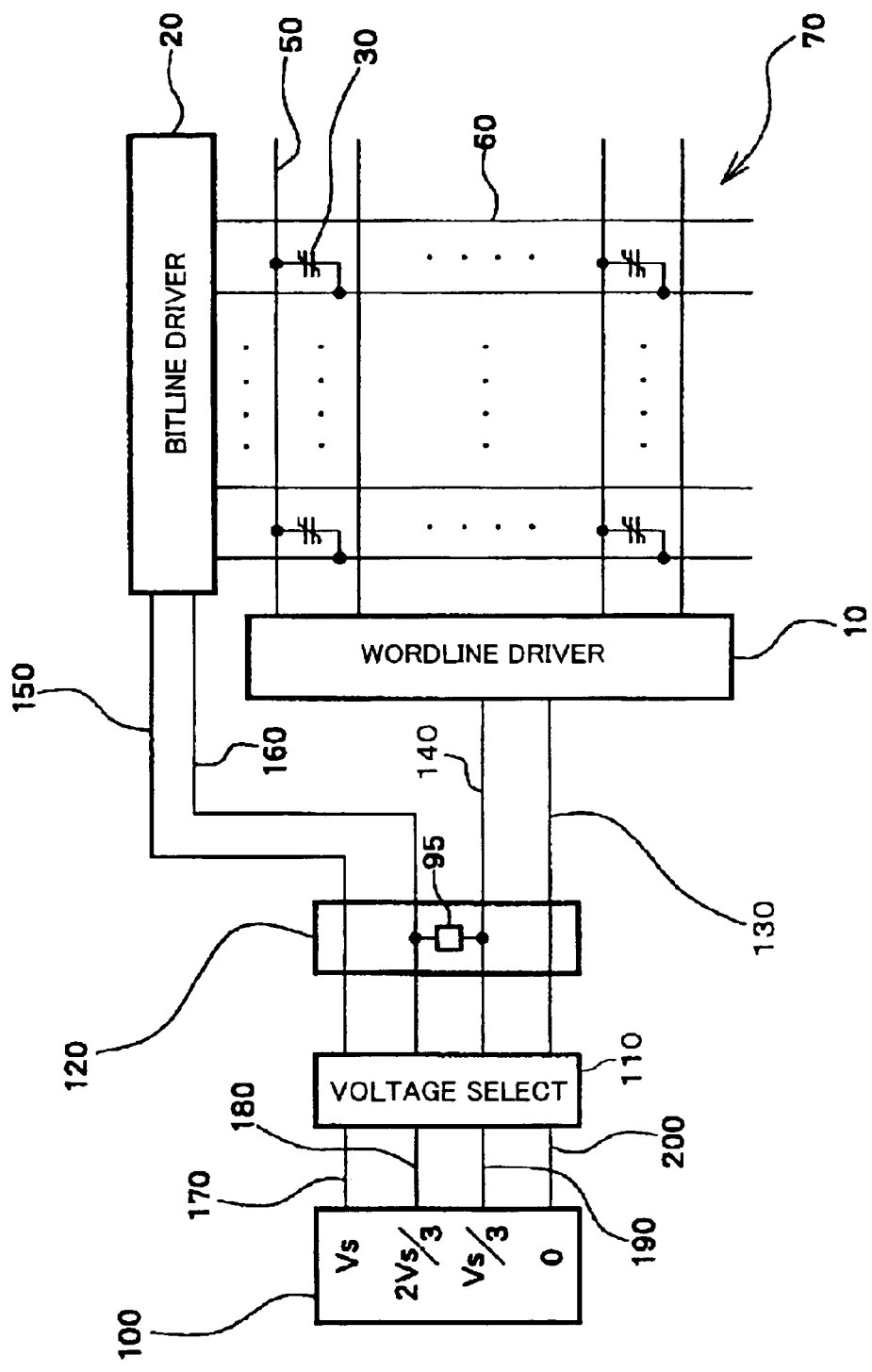
FIG. 11 is a block diagram of a ferroelectric memory device according to a third embodiment of the present invention.

FIG. 11 is a block diagram of a ferroelectric memory device according to a third embodiment of the present invention.

The present embodiment differs from the first embodiment in the configuration of the short circuit 120. In the present embodiment, a switch circuit 95 is provided in the short circuit 120 instead of the switch circuits 80 used in the short circuit 120 in the first embodiment. The switch circuit 95 in the present embodiment is disposed in a manner differing from the switch circuits 80 in the first embodiment.

In the first embodiment, the switch circuits 80 are disposed so that all of the voltage supply line 130 for the selected word line, the voltage supply line 140 for the unselected word line, the Voltage supply line 150 for the selected bit line, and the voltage supply line 160 for the unselected bit line are short-circuited. In the present embodiment, the switch circuit 95 is disposed so that the voltage supply line 140 for the unselected word line and the voltage supply line 160 for the unselected bit line are short-circuited.

Figure 12:
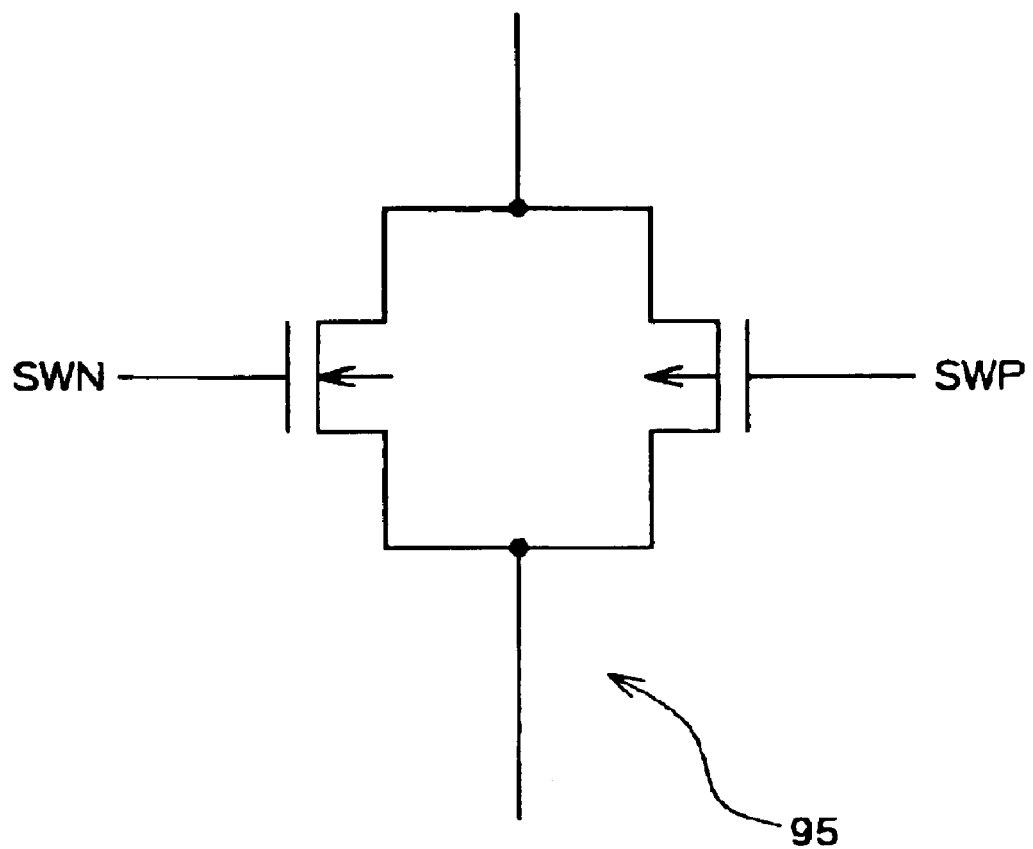
FIG. 12 is an equivalent circuit diagram of a switch circuit according to the third embodiment of the present invention.

FIG. 12 shows an equivalent circuit of the switch circuit 95.

Operation

The operation of the ferroelectric memory device shown in FIG. 11 is described below.

In the present embodiment, the ferroelectric capacitor 30 in the memory cell array 70 is driven by the word line driver section 10 connected with the voltage supply line 130 for the selected word line and the voltage supply line 140 for the unselected word line, and the bit line driver section 20 connected with the voltage supply line 150 for the selected bit line and the voltage supply line 160 for the unselected bit line in the same manner as in the first embodiment. However, the operation of the short circuit 120 in the present embodiment differs from the operation of the short circuit 120 in the first embodiment.

Figure 13:
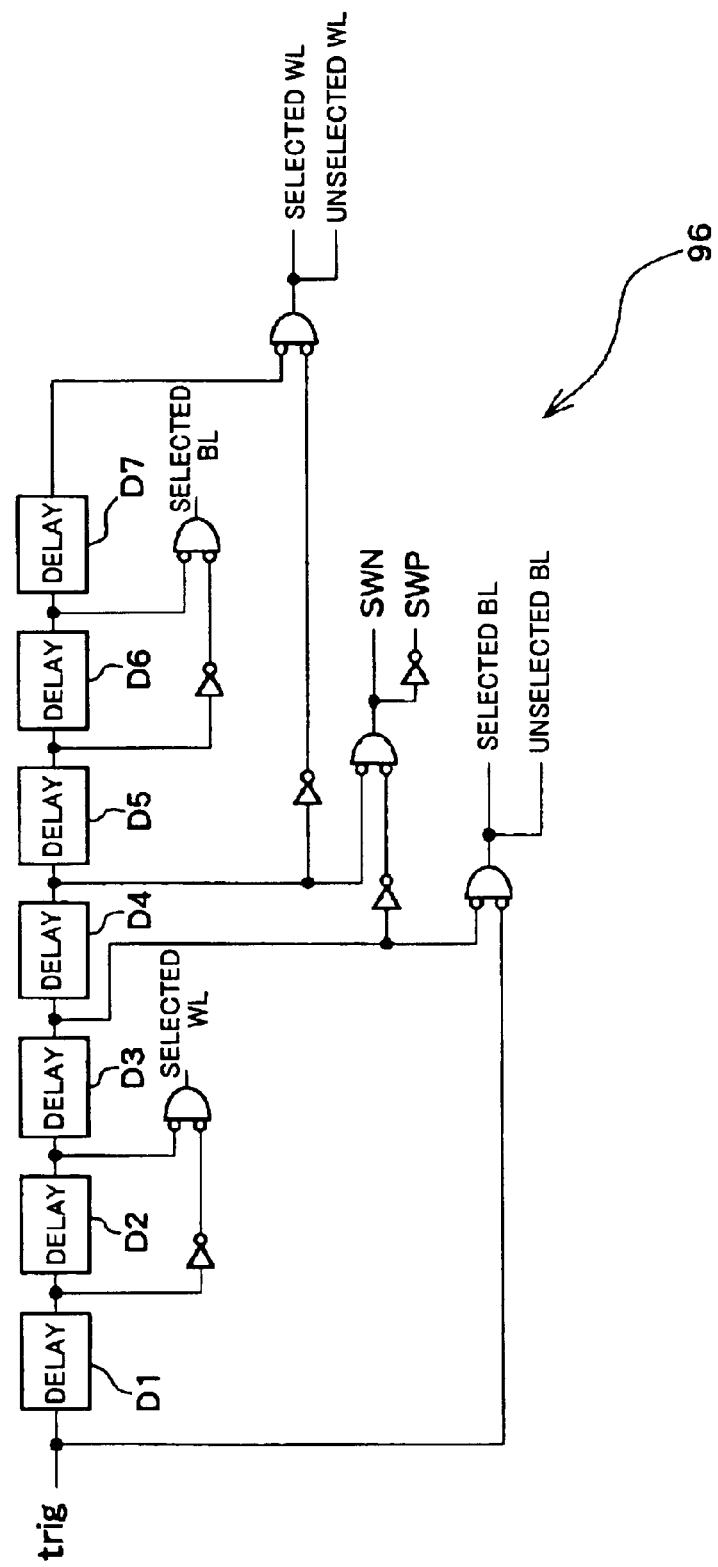
FIG. 13 is an equivalent circuit diagram of delay circuits used to drive memory cells according to the third embodiment of the present invention.

FIG. 13 shows a control circuit 96 which controls the switch 95 and the like shown in FIG. 12.

The circuit 96 outputs signals which drive the selected word line, the unselected word line, the selected bit line, the unselected bit line, and the third switch circuit 83. Each of delay circuits D1 to D7 shown in FIG. 13 delays the signal for a given period of time. The delay circuits D1, D2, and D3 create time intervals during reading, and the delay circuits D5, D6, and D7 create time intervals during writing. The delay circuit D4 indicates a time interval between read and write.

In the control circuit 96 shown in FIG. 13, the switch circuit 95 is in an on state in a period between read and write. The period between read and write corresponds to the time interval created by the delay circuit D4. Specifically, the unselected word lines and the unselected bit lines can be short-circuited in the period between read and write.

Figure 14:
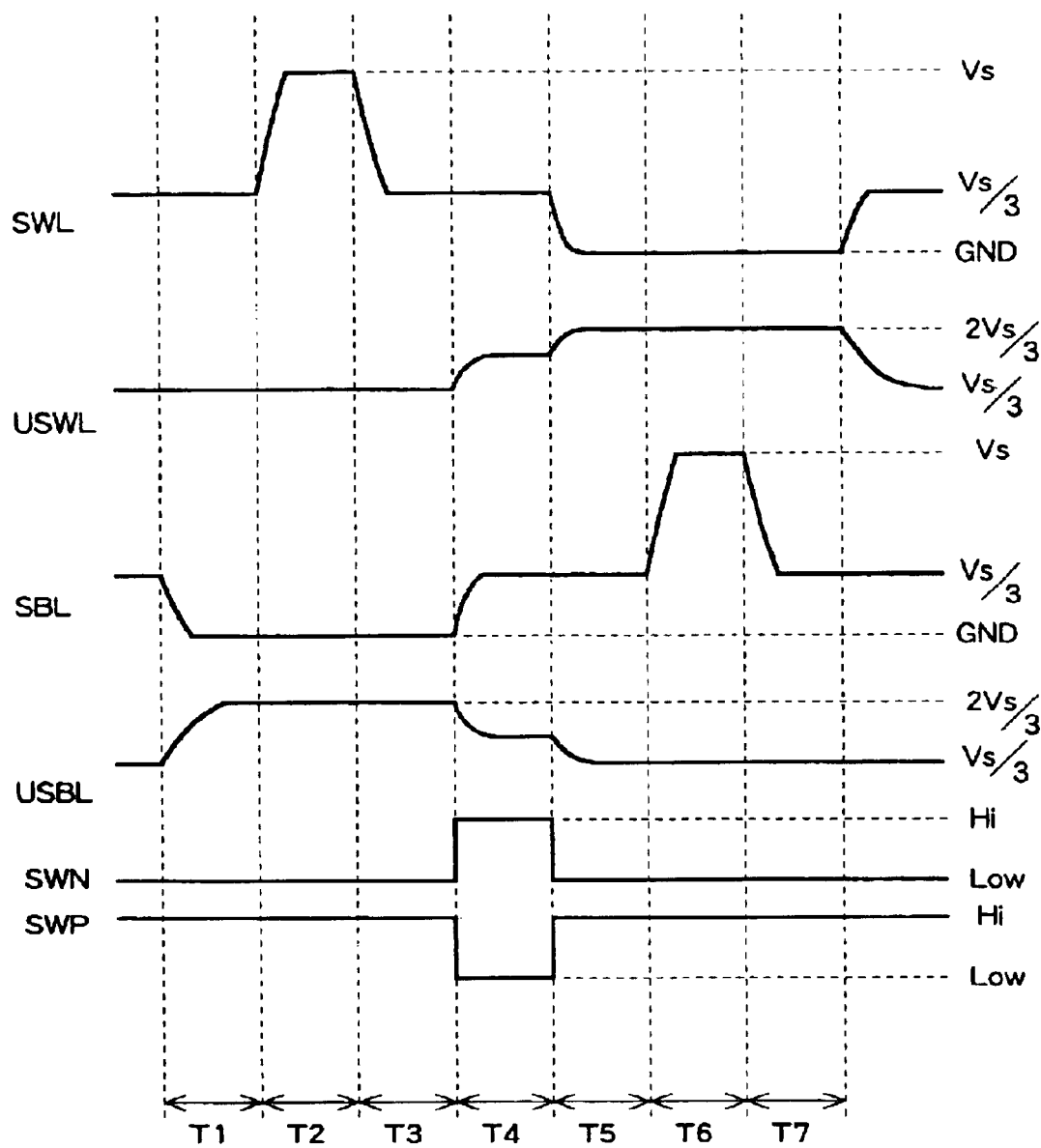
FIG. 14 is a waveform diagram of voltages applied to word lines, bit lines, and a switch circuit according to the third embodiment of the present invention.

In order to explicitly describe this effect, the waveform diagram of the voltages applied to the word lines and the bit lines and the operation of the switch circuit 95 are shown in FIG. 14.

The switch circuit 95 is formed by using an NMOS transistor and a pMOS transistor. Therefore, the switch circuit 95 is turned on when the voltage level Hi is supplied to an nMOS gate terminal and the voltage level Low is supplied to a pMOS gate terminal.

In the waveform diagram shown in FIG. 14, symbols SWN and SWP indicate the waveform input to the nMOS transistor and the pMOS transistor of the switch circuit 95.

The period T4 of the rectangular wave in this waveform indicates the on state of the switch circuit 95. Since each of the waveforms shown in FIG. 14 is illustrated as a timing chart on the same time axis, the voltage states of the word lines 50 and the bit lines 60 when the switch circuit 95 is in an on state can be read from FIG. 14. The switch circuit 95 is turned on by the delay circuits D1 to D7 shown in FIG. 13 in a period between read and write, thereby short-circuiting the unselected word lines and the unselected bit lines in a period in which the switch circuit 95 is in an on state.

In FIG. 14, the unselected word line and the unselected bit line are set at the same voltage, that is, set at an intermediate voltage between 2Vs/3 and Vs/3 in a period in which the unselected word lines and the unselected bit lines are short-circuited. When the operation transitions to write, the voltage 2Vs/3 is supplied to the unselected word lines and the voltage Vs/3 is supplied to the unselected bit lines. The unselected word lines are set at the voltage Vs/3 during reading, and set at the voltage 2Vs/3 during writing. In other words, a charge must be supplied when the operation transitions from read to write. The unselected bit lines 60 are set at the voltage 2Vs/3 during reading, and set at the voltage Vs/3 during writing. In other words, a charge must be released when the operation transitions from read to write. Specifically, the short-circuit operation between the unselected word lines and the unselected bit lines by using the short circuit 120 enables an unnecessary charge released from the unselected bit lines when transitioning from read to write to be supplied to the unselected word lines as a charge necessary when transitioning from read to write.

The present embodiment thus enables unnecessary power consumption as in a conventional method to be reduced by performing the short-circuit operation when charging/discharging the unselected word lines and the unselected bit lines from an external power supply when transitioning from read to write. The short-circuit operation performed by the switch circuit 95 also exerts a precharge effect which can reduce the time required for changing the voltage when transitioning from read to write.

As described above, the present embodiment is capable of reducing power consumption.

The present invention is not limited to the above-described embodiments. Various modifications and variations are possible within the spirit and scope of the present invention.

For example, the first embodiment in which all the voltage supply lines 130 to 160 are short-circuited when the power is turned on/off and the third embodiment in which only the voltage supply line 140 for the unselected word line and the voltage supply line 160 for the unselected bit line are short-circuited in a period between write "0" and write "1" may be used in combination. In this case, the switch 95 shown in FIG. 12 is provided instead of the switches 83 and 84 shown in FIG. 8.

What is claimed is:

1. A ferroelectric memory device comprising:
a plurality of word lines disposed in parallel;
a plurality of bit lines disposed in parallel so as to intersect the word lines;
a plurality of ferroelectric memory cells disposed at respective intersecting points of the word lines and the bit lines;
a power supply circuit which generates a plurality of types of voltages including a word voltage and a bit voltage;
a word line driver section which drives the word lines;

a bit line driver section which drives the bit lines;
a plurality of voltage supply lines which supply the plurality of types of voltages to the word line driver section and the bit line driver section from the power supply circuit; and
a short circuit which short-circuits a supply line of the word voltage and a supply line of the bit voltage among the voltage supply lines.

2. The ferroelectric memory device as defined in claim 1, further comprising:
a voltage select circuit which selectively outputs the plurality of types of voltages generated by the power supply circuit to the word line driver section and the bit line driver section,
wherein the voltage supply lines include a plurality of word voltage supply lines which connect the voltage select circuit with the word line driver section, and a plurality of bit voltage supply lines which connect the voltage select circuit with the bit line driver section, and
wherein the short circuit short-circuits at least one of the word voltage supply lines and at least one of the bit voltage supply lines.

3. The ferroelectric memory device as defined in claim 2, wherein the word voltage supply lines include a first voltage-supply-line for a selected word line among the word lines and a second voltage-supply-line for an unselected word line among the word lines, and
wherein the bit voltage supply lines include a third voltage-supply-line for a selected bit line among the bit lines and a fourth voltage-supply-line for an unselected bit line among the bit lines.

4. The ferroelectric memory device as defined in claim 3, wherein the voltage select circuit outputs voltages selected from among the plurality of types of voltages generated by the power supply circuit, corresponding to an access operation for the ferroelectric memory cells, to the first voltage-supply-line, the second voltage-supply-line, the third voltage-supply-line, and the fourth voltage-supply-line.

5. The ferroelectric memory device as defined in claim 3, wherein the short circuit short-circuits all of the word voltage supply lines and the bit voltage supply lines when the power is turned on.

6. The ferroelectric memory device as defined in claim 3, wherein the short circuit short-circuits all of the word voltage supply lines and the bit voltage supply lines when the power is turned off.

7. The ferroelectric memory device as defined in claim 3, wherein a data read operation or a data write operation of a selected memory cell among the ferroelectric memory cells is implemented by executing at least one of operations of writing "0" and writing "1" into the selected memory cell, and
wherein the short circuit short-circuits all of the word voltage supply lines and the bit voltage supply lines after at least one of the operations of writing "0" or writing "1" has been executed.

8. The ferroelectric memory device as defined in claim 3, wherein a data read operation or a data write operation of a selected memory cell among the ferroelectric memory cells is implemented by executing at least one of operations of writing "0" and writing "1" into the selected memory cell, and
wherein the short circuit short-circuits the second voltage-supply-line and the fourth voltage-supply-line during a period between the operations of writing "0" and writing "1".

9. The ferroelectric memory device as defined in claim 3, wherein a data read operation or a data write operation of a selected memory cell among the ferroelectric memory cells is implemented by executing at least one of operations of writing "0" and writing "1" into the selected memory cell, and
wherein the short circuit includes a third switch circuit which short-circuits the second voltage-supply-line and the fourth voltage-supply-line during a period between the operations of writing "0" and writing "1".

10. The ferroelectric memory device as defined in claim 3,
wherein a data read operation or a data write operation of a selected memory cell among the ferroelectric memory cells is implemented by executing at least one of operations of writing "0" and writing "1" into the selected memory cell,
wherein the short circuit includes:
a plurality of first switch circuits which short-circuit all of the word voltage supply lines and the bit voltage supply lines when a power is turned on;
a plurality of second switch circuits which short-circuit all of the word voltage supply lines and the bit voltage supply lines when a power is turned off; and
a third switch circuit which short-circuits the second voltage-supply-line and the fourth voltage-supply-line during a period between the operations of writing "0" and writing "1", and
wherein the third switch circuit is connected in parallel with the first and second switch circuits between the second voltage-supply-line and the fourth voltage-supply-line.

11. The ferroelectric memory device as defined in claim 1, wherein the short circuit includes a plurality of switch circuits which short-circuit all of the word voltage supply lines and the bit voltage supply lines when a power is turned on.

12. The ferroelectric memory device as defined in claim 1,
wherein the short circuit includes a plurality of switch circuits which short-circuit all of the word voltage supply lines and the bit voltage supply lines when a power is turned off.

13. The ferroelectric memory device as defined in claim 1,
wherein the short circuit includes:
a plurality of first switch circuits which short-circuit all of the word voltage supply lines and the bit voltage supply lines when a power is turned on; and
a plurality of second switch circuits which short-circuit all of the word voltage supply lines and the bit voltage supply lines when a power is turned off, and
wherein each of the second switch circuits is connected in parallel with corresponding one of the first switch circuits.

14. The ferroelectric memory device as defined in claim 1,
wherein a data read operation or a data write operation of a selected memory cell among the ferroelectric memory cells is implemented by executing at least one of operations of writing "0" and writing "1" into the selected memory cell, and
wherein the short circuit includes a plurality of switch circuits which short-circuit all of the word voltage supply lines and the bit voltage supply lines after at least one of the operations of writing "0" or writing "1" has been executed.

15. The ferroelectric memory device as defined in claim 1,
wherein a data read operation or a data write operation of a selected memory cell among the ferroelectric memory cells is implemented by executing at least one of operations of writing "0" and writing "1" into the selected memory cell,
wherein the short circuit includes:
a plurality of first switch circuits which short-circuit all of the word voltage supply lines and the bit voltage supply lines when a power is turned on;
a plurality of second switch circuits which short-circuit all of the word voltage supply lines and the bit voltage supply lines when a power is turned off; and
a plurality of third switch circuits which short-circuit all of the word voltage supply lines and the bit voltage supply lines after at least one of the operations of writing "0" or writing "1" has been executed, and
wherein each of the first switch circuits is connected in parallel with corresponding one of the second switch circuits and corresponding one of the third switch circuits.

* * * * *